(12) United States Patent
Higashi et al.

(10) Patent No.: US 6,861,284 B2
(45) Date of Patent: Mar. 1, 2005

(54) SEMICONDUCTOR DEVICE AND PRODUCTION METHOD THEREOF

(75) Inventors: Mitsutoshi Higashi, Nagano (JP); Kei Murayama, Nagano (JP); Hideaki Sakaguchi, Nagano (JP); Hiroko Koike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/335,689

(22) Filed: Jan. 2, 2003

(65) Prior Publication Data

US 2003/0102547 A1 Jun. 5, 2003

Related U.S. Application Data (62) Division of application No. 09/734,855, filed on Dec. 11, 2000, now abandoned.

(30) Foreign Application Priority Data

Dec. 16, 1999 (JP) .......................................... 11-357747

(51) Int. Cl.[7] .......................... H01L 21/44; H01L 21/48; H01L 21/50; H01L 21/4763
(52) U.S. Cl. ...................... 438/107; 438/108; 438/109; 438/622; 438/623; 438/624
(58) Field of Search ................................. 438/107–109, 438/622–624

(56) References Cited

U.S. PATENT DOCUMENTS

| 5,157,589 | A | | 10/1992 | Cole, Jr. et al. |
| 5,524,339 | A | * | 6/1996 | Gorowitz et al. ............. 29/841 |
| 5,565,706 | A | * | 10/1996 | Miura et al. ................ 257/723 |
| 6,025,995 | A | * | 2/2000 | Marcinkiewicz ............ 361/760 |
| 6,759,268 | B2 | * | 7/2004 | Akagawa ..................... 438/106 |

\* cited by examiner

Primary Examiner—Erik Kielin
(74) Attorney, Agent, or Firm—Paul & Paul (57) ABSTRACT

In a semiconductor device including an insulating core substrate, a plurality of layers of wiring patterns on the core substrate and insulating layers interposed between the wiring patterns, each adjacent pair of the wiring patterns being electrically connected through a conductor portion penetrating through the insulating layer interposed between them, each of the insulating layers is formed integrally, semiconductor chips thinner than one layer of the insulating layer are mounted into at least one of the insulating layers, and the semiconductor chips are electrically connected to one layer of the wiring pattern of one insulating layer adjacent on the side of the core substrate.

4 Claims, 6 Drawing Sheets

Fig. 7
PRIOR ART

SEMICONDUCTOR DEVICE AND PRODUCTION METHOD THEREOF

CROSS REFERENCE TO RELATED APPLICATIONS

This is a divisional application of U.S. application Ser. No. 09/734,855, filed Dec. 11, 2000 now abandoned.

BACKGROUND OF THE INVENTION

1. Field of the Invention

This invention relates to a semiconductor device having a plurality of semiconductor chips mounted on one package and a production method thereof.

2. Description of the Related Art

Semiconductor devices of the type in which a plurality of semiconductor chips are mounted to one substrate, or of the type in which circuit components such as capacitors and resistors are mounted together with semiconductor chips on one substrate have been offered in the past as products that are compact in size and yet have versatile functions.

Figure 6:
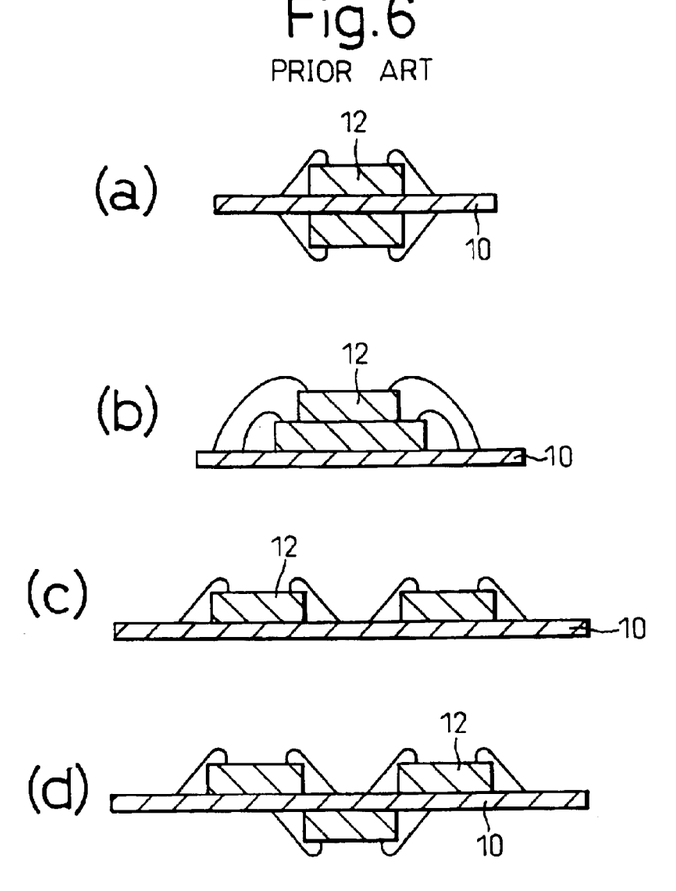
FIG. 6 is a sectional view showing a construction of a conventional semiconductor device having a plurality of semiconductor chips mounted to a substrate.

FIG. 6 of the accompanying drawings shows a structural example of a semiconductor device including a plurality of semiconductor chips 12 mounted to one substrate 10. FIG. 6(a) shows an example where the semiconductor chips 12 are mounted on both surfaces of the substrate 10. FIG. 6(b) shows an example where the semiconductor chips 12 are stacked and mounted on one of the surfaces of the substrate 10. FIG. 6(c) shows an example including a plurality of semiconductor chips 12 mounted on one of the surfaces of the semiconductor substrate 10. FIG. 6(d) shows an example where the semiconductor chips 12 are mounted on both surfaces of the substrate and a plurality of semiconductor chips 12 are further mounted on the surface of the substrate.

A wiring pattern is formed on the surface of the substrate 10. In all the examples shown in the drawings, the semiconductor chips 12 and the wiring pattern are electrically connected to one another by wire bonding. Needless to say, flip-chip bonding, TAB connection, and so forth, can be utilized, instead of wire bonding to electrically connect the semiconductor chips 12 and the wiring pattern.

When a plurality of semiconductor chips are mounted on the surface of the substrate 10 in the semiconductor devices of the types described above, the size of the substrate limits the number of semiconductor chips 12 that can be mounted. When the semiconductor chips 12 are stacked and mounted, too, it is not easy to mount a large number of semiconductor chips. When these semiconductor chips 12 and circuit substrates are mounted to one package in this way, the number of semiconductor chips 12 that can be mounted is limited by the method that merely mounts the semiconductor chips 12 on the substrate 10, and this method cannot yet provide a high integration density and multiple functions.

Figure 7:
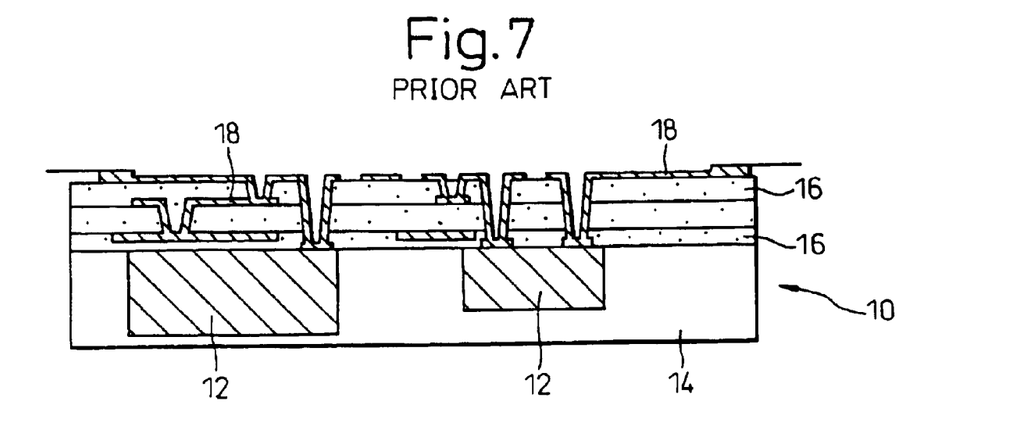
FIG. 7 is a sectional view showing a construction of a conventional semiconductor device having semiconductor chips buried in a substrate.

Therefore, a method that laminates wiring patterns, that are to be formed over the substrate, through electric insulating layers, and assembles the semiconductor chips inside the substrate has been proposed as a method of providing a higher integration density and multiple functions of semiconductor devices. FIG. 7 shows an example of such a method. Semiconductor chips 12 are buried into a resin substrate 14, wiring patterns 18 are laminated through electric insulating layers 16, and the wiring patterns 18 and the semiconductor chips 12 are electrically connected to give a semiconductor device.

Extremely thin semiconductor wafers have been produced in recent years, and semiconductor chips having a thickness of about 50 $\mu$m have been fabricated. Electric insulating layers for laminating wiring patterns have a thickness of about 100 $\mu$m. Therefore, semiconductor chips and circuit components can be buried and assembled into a package by using the thin-type semiconductor chips.

SUMMARY OF THE INVENTION

As described above, semiconductor chips and the circuit components that are extremely thin and small in size have recently been produced, and semiconductor devices having these semiconductor chips and circuit components assembled inside a package can now be produced.

It is an object of the present invention to provide a semiconductor device having the built-in semiconductor chips, etc, and being capable of effectively achieving high integration density and multiple functions, and a production method of a semiconductor device that can reliably produce a semiconductor device having built-in semiconductor chips, and the like.

To accomplish the objects described above, the present invention provides a semiconductor device including an insulating core substrate, a plurality of layers of wiring patterns on the core substrate and insulating layers each interposed between the wiring patterns, each adjacent pair of the wiring patterns being electrically connected to each other through a conductor portions penetrating through the insulating layer interposed between the adjacent wiring patterns, wherein each of the insulating layers is formed integrally, and a semiconductor chip is mounted in at least one of the insulating layers, is thinner than said at least one insulating layer and is electrically connected by flip-chip bonding to one layer of the wiring patterns adjacent to at least one insulating layer on the side of the core substrate.

In the semiconductor device according to the present invention, circuit components such as capacitors, resistors, etc, thinner than said at least one insulating layer may be mounted in said at least one insulating layer and may be electrically connected to the wiring pattern.

In a preferred embodiment according to the present invention, the wiring patterns are formed on both surfaces of the core substrate, and are electrically connected to each other through conductor portions so disposed as to penetrate through the core substrate.

According to another aspect of the present invention, there is provided a method of producing a semiconductor device including an insulating core substrate, a plurality of layers of wiring patterns on the core substrate, and insulating layers each interposed between the wiring patterns, each adjacent pair of the wiring patterns being electrically connected to each other through conductor portions penetrating through the insulating layer interposed between the adjacent wiring patterns, the method comprising the steps of: press-bonding an electric insulating film to a surface of the core substrate, on which surface semiconductor chips connected electrically to the wiring patterns by flip-chip bonding are mounted, to form an electric insulating layer covering the semiconductor chips and the wiring patterns; forming via-holes in the electric insulating layers to expose the wiring pattern as a bottom thereof; forming a plating power feeding layer for electrolytic plating on an inner surface of the via-holes and on a surface of the electric insulating layer, electrolytically plating the plating power feed layer to form a via-portion on the inner surface of each of the via-holes and a conductor layer on the surface of the electric insulating layer; etching the conductor layer to form a wiring pattern electrically connected to the wiring pattern of a lower layer through the via-portion; and mounting the semiconductor chips on the wiring pattern, and forming an electrical connection, by flip-chip bonding.

According to still another aspect of the present invention, there is provided a method of producing a semiconductor device including an insulating core substrate, a plurality of layers of wiring patterns on the core substrate, and insulating layers each interposed between the wiring patterns, each adjacent pair of the wiring patterns being electrically connected to each other through conductor portions penetrating through the insulating layer interposed between the adjacent wiring patterns, the method comprising the steps of: press-bonding an electric insulating film to a surface of the core substrate, on which surface semiconductor chips connected electrically to the wiring patterns by flip-chip bonding are mounted, to form an electric insulating layer covering the semiconductor chips and the wiring patterns; forming via-holes in the electric insulating layer to expose the wiring patterns as a bottom thereof; forming a plating power feeding layer for electrolytic plating, on an inner surface of the via-holes and on a surface of the electric insulating layers; forming a resist pattern exposing a portion, on which the wiring pattern is to be formed, on the plating power feed layer, and conducting electrolytic plating with the resist pattern as a mask; removing the resist pattern, removing the plating power feed layer exposed after the removal of the resist pattern, and forming a wiring pattern electrically connected to the wiring pattern of a lower layer through a via-portion formed in each of the via-holes; and mounting semiconductor chips on the wiring pattern, and forming an electric connection, by flip-chip bonding.

According to still another aspect of the present invention, there is provided a method of producing a semiconductor device including an insulating core substrate, a plurality of layers of wiring patterns on the core substrate, and insulating layers each interposed between the wiring patterns, each adjacent pair of the wiring patterns being electrically connected to each other through conductor portions penetrating through the insulating layer interposed between the adjacent wiring patterns, the method comprising the steps of: press-bonding one of the surfaces of an electric insulating film having a conductor layer formed on the other surface thereof to a surface of the core substrate, on which surface semiconductor chips connected electrically to the wiring pattern by flip-chip bonding are mounted, to form an electric insulating layer covering the semiconductor chips and the wiring patterns; etching the conductor layer to form a wiring pattern on a surface of the electric insulating layer; forming via-holes in the electric insulating layer to expose the wiring pattern of a lower layer as a bottom thereof; forming a connection portion in each of the via-holes so as to electrically connect the wiring pattern of a lower layer and the wiring pattern formed in the electric insulating layer; and mounting the semiconductor chips, and forming an electrical connection, by flip-chip bonding to the wiring pattern formed on the surface of the electric insulating layer.

According to still another aspect of the present invention, there is provided a method of producing a semiconductor device including an insulating core substrate, a plurality of layers of wiring patterns on the core substrate, and insulating layers each interposed between the wiring patterns, each adjacent pair of the wiring patterns being electrically connected to each other through conductor portions penetrating through the insulating layer interposed between the adjacent wiring patterns, the method comprising the steps of: press-bonding one of the surfaces of an electric insulating film having the semiconductor chips mounted thereon and electrically connected to the wiring pattern by flip-chip bonding and having a predetermined wiring pattern formed on the other surface thereof, to a surface of the core substrate, on which surface semiconductor chips connected electrically to the wiring pattern by flip-chip bonding are mounted, to form an electric insulating layer covering the semiconductor chips and the wiring patterns; forming via-holes in the electric insulating layer to expose the wiring pattern of a lower layer as a bottom thereof; and forming a connection portion in each of the via-holes to electrically connect the wiring pattern of a lower layer to the wiring pattern formed on the electric insulating layer.

DESCRIPTION OF THE PREFERRED EMBODIMENTS

Hereinafter, preferred embodiments of the present invention will be explained in detail with reference to the accompanying drawings.

Figure 1:
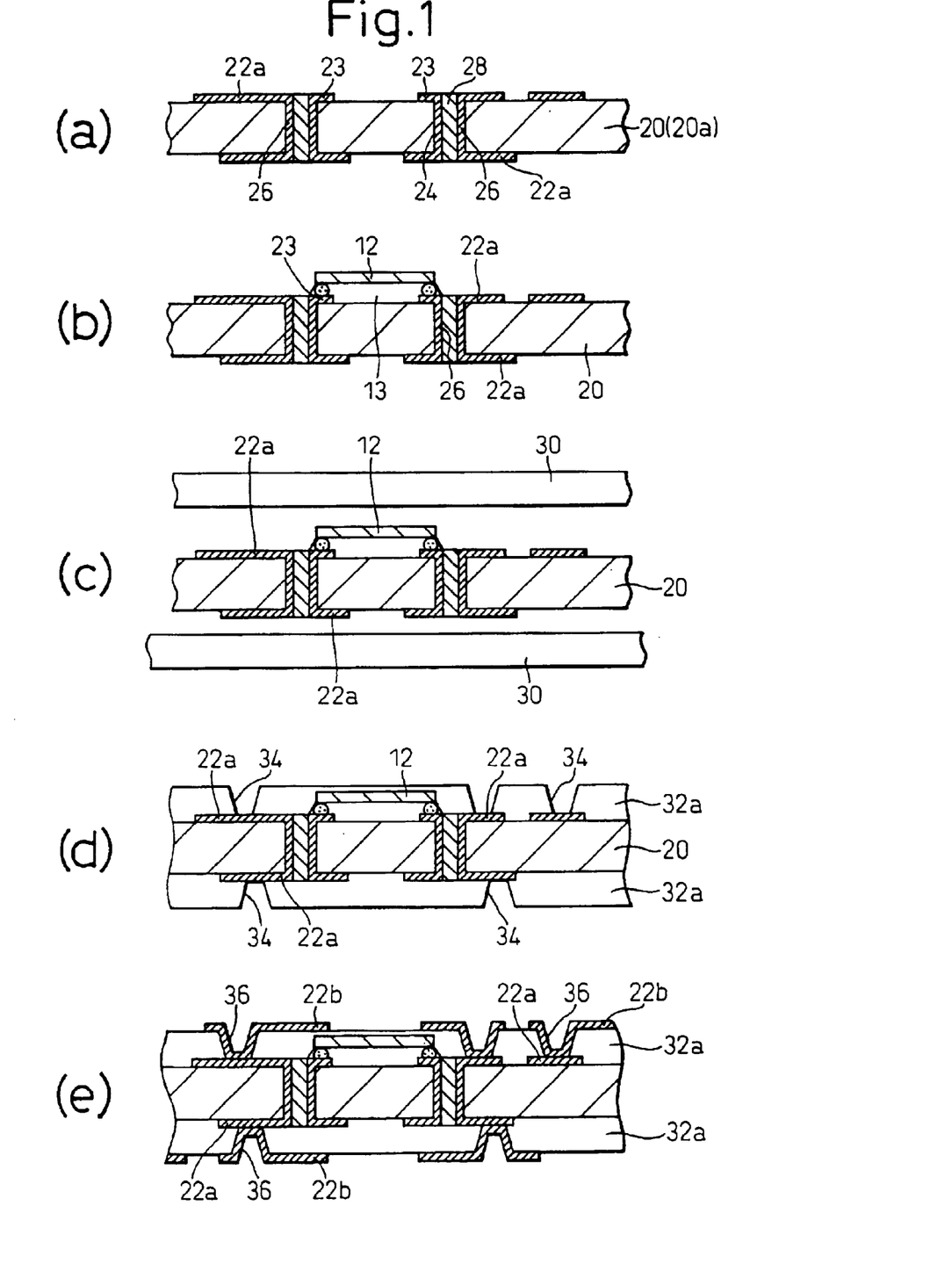
FIG. 1 is an explanatory view showing a production method of a semiconductor device according to the present invention.
Figure 2:
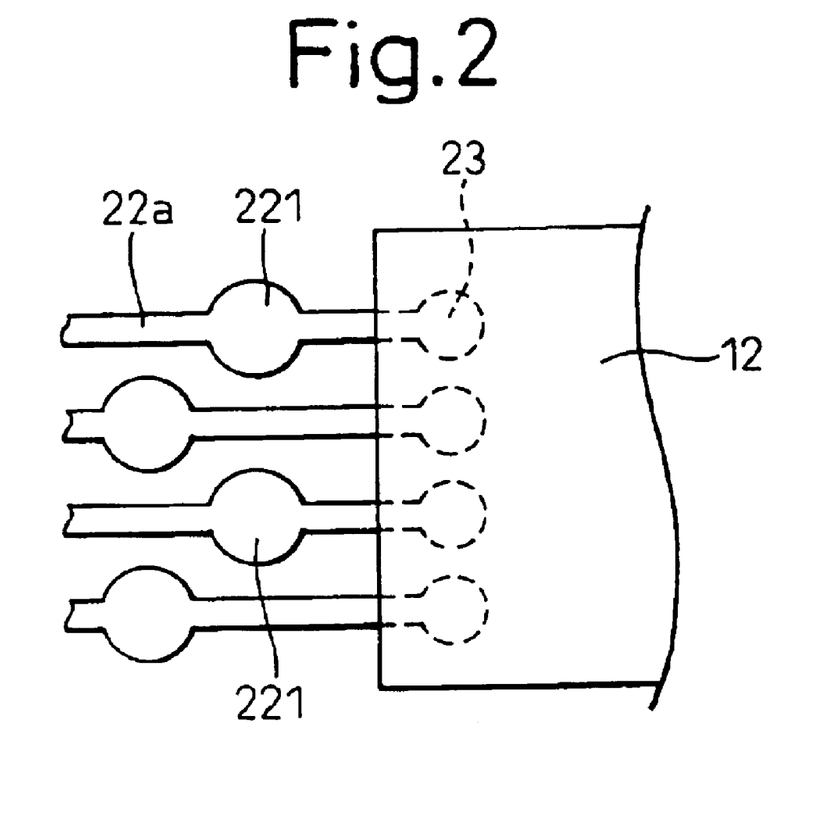
FIG. 2 is an explanatory view showing the state where testing pads are formed on a wiring pattern.

FIGS. 1 and 2 are explanatory views showing a method of producing a semiconductor device according to the present invention. FIG. 1(a) shows a core substrate 20 for forming wiring patterns on both surfaces thereof. The wiring patterns 22a are formed on both surfaces of the core substrate 20, and are electrically connected to each other through conductor portions 26 formed on an inner wall surface of through-holes 24 so formed as to penetrate through a resin substrate 20a.

The core substrate 20 is formed in the following way, for example. The resin substrate 20a having a copper foil deposited to both surfaces thereof is first etched chemically to remove the copper foil. The through-holes 24 are then formed in the resin substrate 20a. Electroless copper plating and electrolytic copper plating are conducted to form the conductor portion 26 inside each through-hole 24, and to form a conductor layer on the surface of the resin substrate 20a. The conductor layer is chemically etched to give the wiring pattern 22a. Because the copper foil deposited to the resin substrate 20a is etched away, adhesion between the conductor layer formed by electroless copper plating and electrolytic copper plating and the resin substrate 20a can be improved. Because the conductor layer is formed to a small thickness by plating, the wiring pattern 22a can be formed in a high density. Reference numeral 28 denotes a resin material packed into the through-hole 24.

FIG. 1(b) shows the state where semiconductor chips 12 are mounted to one of the surfaces of the core substrate 20. In this embodiment, each semiconductor chip 12 is mounted by a flip-chip method. Reference numeral 23 in FIG. 1(a) denotes a pad portion for connecting the semiconductor chip 12 by the flip-chip bonding method. Since the semiconductor chip 12 has a thickness of about 50 µm, the height of a bump for flip-chip bonding is about 20 µm. The bump is typically made of solder and may be made of other metals such as gold.

The mounting method of the semiconductor chip 12 by flip-chip bonding provides the advantage that the semiconductor chip 12 can be tested while it is being mounted. When the functions of the semiconductor chips 12 can be tested, extremely large advantages can be obtained in the case of a semiconductor device having a large number of semiconductor chips 12 mounted thereto in order to improve the reliability of products and to lower a defect ratio. To test the semiconductor chips 12, it is advisable to form testing pads 221 shown in FIG. 2 when the wiring pattern 22a is formed. The testing pads 221 are used for connecting terminals of a testing apparatus.

The semiconductor chips 12 that prove defective by the test can be removed from the substrate by re-heating to melt the bumps, and new semiconductor chips 12 are mounted after the pad portions 23 are cleaned.

When the semiconductor chips 12 are mounted by flip-chip bonding, an under-fill material 13 may be packed to the lower surface of the semiconductor chips 12 so that the semiconductor chips 12 can be reliably bonded to the core substrate 20.

FIG. 1(b) shows the state where one semiconductor chip 12 is mounted to one of the surfaces of the core substrate 20, but the semiconductor chip 12 can also be mounted to the other surface of the core substrate 20. Further, a plurality of semiconductor chips 12 can be mounted to one, or both, of the surfaces.

FIG. 1(c) shows a step of bonding electric insulating pre-pregs 30 and 30 to both surfaces of each core substrate 20 in order to form electric insulating layers on both surfaces of the core substrate 20 after the semiconductor chip 12 is mounted. The pre-pregs 30 and 30 can be obtained by shaping a thermosetting resin such as a polyphenylene ether or a polyimide into a film shape having adhesion property. They are bonded to the core substrate 20 by thermal press-bonding, and serve as the electric insulating layers 32a that electrically insulate the wiring patterns. This embodiment uses the pre-pregs 30 and 30 that provide a thickness of about 100 µm to the electric insulating layer 32a. In consequence, the semiconductor chip 12 and the wiring pattern 22a of the first layer are covered with the electric insulating layer 32a.

FIG. 1(d) shows the state where via-holes 34 are formed after the pre-pregs 30 are bonded to both surfaces of the core substrate 20. The via-holes 34 are formed by irradiating a laser beam onto the electric insulating layer 32a and exposing the wiring pattern 22a of the lower layer to the bottom surface at predetermined positions of the electric insulating layer 32a.

Next, electroless copper plating and electrolytic copper plating are conducted to cover the bottom surface and inner wall surface of the via-hole 34 with the conductor layer and to form the conductor layer on the surface of the electric insulating layer 32a. The conductor layer on the surface of the electric insulating layer 32b is etched to form a conductor pattern 22b of the second layer. The conductor layer deposited to the inner surface of the via-hole 34 functions as a via-portion 36 that electrically connects the wiring pattern 22a of the first layer to the wiring pattern 22b of the second layer (FIG. 1(c)). Incidentally, the inside of the via-hole 34 may be packed with plating, in which the via-hole 34 is packed with electrolytic copper plating applied on an electroless copper plating.

Figure 3:
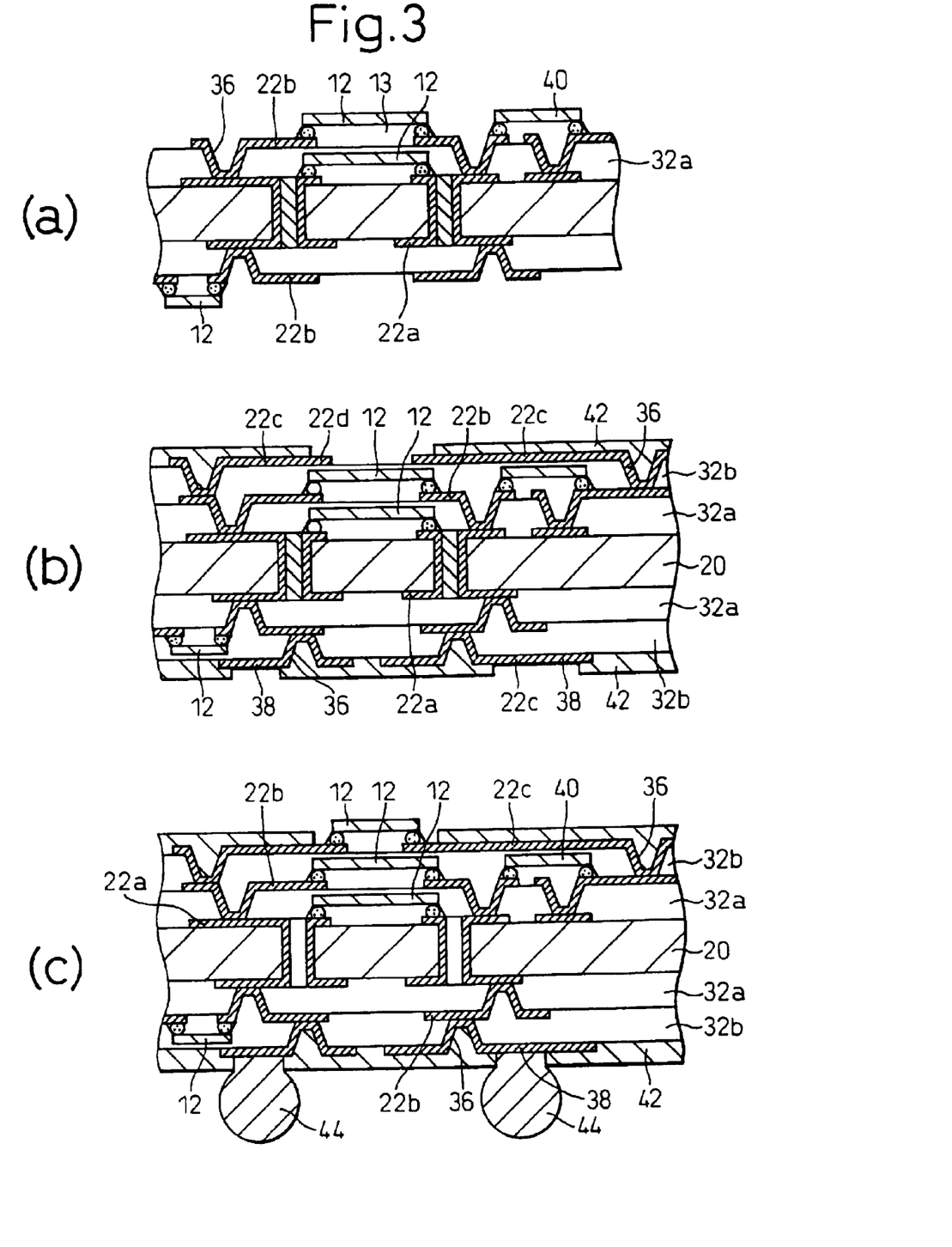
FIG. 3 is an explanatory view showing a production method of a semiconductor device according to the present invention.

FIG. 3(a) shows the state where the semiconductor chip 12 is mounted by flip-chip bonding to the substrate on which the wiring pattern 22b of the second layer is formed. The mounting method of the semiconductor chip 12 is the same as the mounting method of the semiconductor chip 12 to the first layer. While the semiconductor chip 12 is being connected afresh by flip-chip bonding, the test of the semiconductor chip 12 and other conduction tests are carried out. In this case, too, testing pads are formed on the wiring pattern 22b in the same way as in FIG. 2.

In FIG. 3(a), circuit components such as capacitors, resistors, etc, are shown mounted besides the semiconductor chips 12. This mounting method of the circuit components 40 such as the capacitors and resistors as the chip components is effective because it can easily mount even capacitors having large capacity, and so forth.

FIG. 3(b) shows the state where the pre-pregs 30 are heat-bonded to both surfaces of the substrate from the state shown in FIG. 3(a) to form electric insulating layers 32b as the second layer, and a wiring pattern 22c of the third layer is so formed on the surface of this electric insulating layer 32b as to be electrically connected to the wiring pattern 22b. The construction in which the second layer wiring pattern 22b and the third layer wiring pattern 22c are electrically connected through the via-portion 36 is the same as the construction in which the first layer wiring pattern 22a and the second layer wiring pattern 22b are electrically connected through the via-portion 36.

After the wiring pattern 22c is formed, the surface of the substrate is covered with a protective film 42 such as a solder resist. The protective film 42 covers the surface of the substrate other than the connection portion 22d connected by flip-chip bonding to the semiconductor chip 12 and land portions 38 for connecting external connection terminals among the wiring pattern 22c.

FIG. 3(c) shows the state where the semiconductor chips 12 are mounted to one of the surfaces of the substrate and external connection terminals 44 are bonded to the other surface of the substrate, finally completing the semiconductor device. The semiconductor chips 12 are mounted by flip-chip bonding to the third layer, too. Solder balls are bonded to the land portions 38 to fit the external connection terminals 44.

In the semiconductor device according to this embodiment, the wiring patterns 22a, 22b and 22c are laminated through the electric insulating layers 32a and 32b, and the semiconductor chips 12 and the circuit components 40 disposed inside the substrate are electrically connected to the wiring patterns 22a, 22b and 22c.

The thickness of the semiconductor chips 12 built in the semiconductor device is about 50 µm and the thickness of the electric insulating layers 32a and 32b is about 100 µm. Therefore, even when the electric insulating layers 32a and 32b are laminated in a plurality of layers over both surfaces of the core substrate 20, the overall thickness of the semiconductor device can be easily limited to about 1 mm or below. In this way, the semiconductor device according to this embodiment can be provided in an extremely compact product form in which a plurality of semiconductor chips 12 and the circuit components 40 are incorporated. The wiring patterns 22a, 22b and 22c formed over the substrate can be appropriately patterned in match with the mounting positions of the semiconductor chips 12 and the circuit components. Therefore, the semiconductor device can be produced while the arrangement of the semiconductor chips 12 and the circuit components 40 is freely set. Since the semiconductor chips 12 and the circuit components 40 are built in the substrate, the distance of the wiring patterns for connecting the components can be shortened, and high-speed signal performance of the semiconductor device can be improved.

Incidentally, the production method of the semiconductor device according to the present invention is not particularly limited to the method described above. To form the wiring patterns 22a, 22b and 22c by lamination, for example, the embodiment described above forms the via-holes 34 in the electric insulating layers 32a and 32b and then forms a power feeding layer for electrolytic copper plating by applying electroless copper plating. However, the plating power feed layer can be formed by a sputtering process in place of electroless copper plating. When the conductor layer is etched to form a predetermined wiring pattern, it is possible to employ a method that etches both the conductor layer formed by electrolytic copper plating and the underlying conductor layer formed by electroless copper plating and forms the wiring pattern, or a method that first forms a plating power feed layer, then forms a resist pattern exposing the portion at which the wiring pattern is formed, conducts electrolytic copper plating to form a wiring pattern portion to a large thickness, removes the resist pattern and etches away the plating power feed layer at portions other than the portions that serves as the wiring pattern (semi-additive method).

Figure 4:
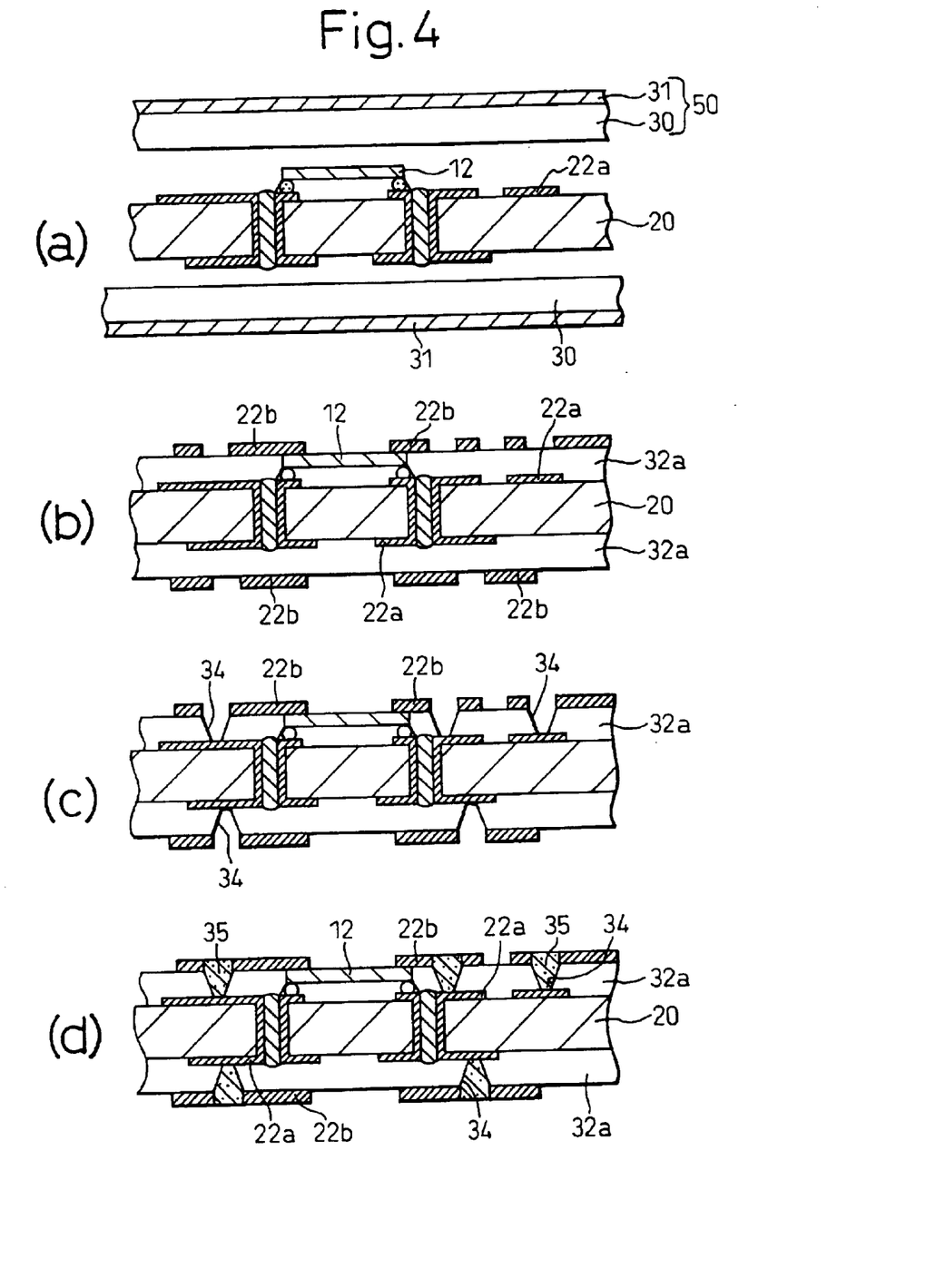
FIG. 4 is an explanatory view showing another production method of a semiconductor device according to the present invention.

FIG. 4 shows a production method of a semiconductor device according to another embodiment of the present invention. This example uses a film material obtained by depositing a copper foil 31 to one of the surfaces of a pre-preg as a film 50 for forming an electric insulating layer when it is heat-bonded to a substrate.

FIG. 4(a) shows a production step of bonding a film 50 formed by depositing the copper foil 31 to one of the surfaces of the pre-preg 30 to the core substrate 20 (under the state shown in FIG. 1(b)) to which semiconductor chips 21 are mounted by flip-chip bonding.

FIG. 4(b) shows the state where the film 50 is heat-bonded to a core substrate 20, electric insulating layers 32a are formed on both surfaces of the core substrate 20 and the copper foil 31 deposited to one of the surfaces of the pre-preg 30 is etched to form a wiring pattern 22b of the second layer.

FIG. 4(c) shows the state where laser beams are irradiated onto the electric insulating layers 32a formed on both surfaces of the core substrate 20 to form via-holes 34. When the copper foil 31 is etched to form the wiring pattern 22b in the process step shown in FIG. 4(b), the copper foil 31 is removed from the portions at which the via-holes 34 are to be formed so that the via-holes 34 can be easily formed by the irradiation of the laser beam. When the electric insulating layer 32a is exposed in match the shape of the via-holes 34, the via-holes 34 having a predetermined shape can be easily formed through irradiation by the laser beam.

FIG. 4(d) shows the state where a conductive paste 35 is packed into the via-holes 34 so as to electrically connect the wiring pattern 22a of the first layer to the wiring pattern 22b of the second layer. It is also possible to form a conductor layer on the inner surface of each via-hole 34 as a connection portion for forming the via-hole 34 to form a via-portion instead of packing the conductive paste 35.

After the wiring patterns 22a and 22b are thus connected electrically, the semiconductor chips 12 of the next layer are mounted while being electrically connected to the wiring pattern 22b of the second layer. In this case, too, the semiconductor chips 12 are mounted by flip-chip bonding in the same way as in the embodiment described already.

When the pre-preg 30 having the copper foil 31 deposited on one of the surfaces thereof is used, the wiring patterns can be serially laminated, and a semiconductor device having the semiconductor chips 12 and the circuit components 40 buried inside the substrate can be produced.

Figure 5:
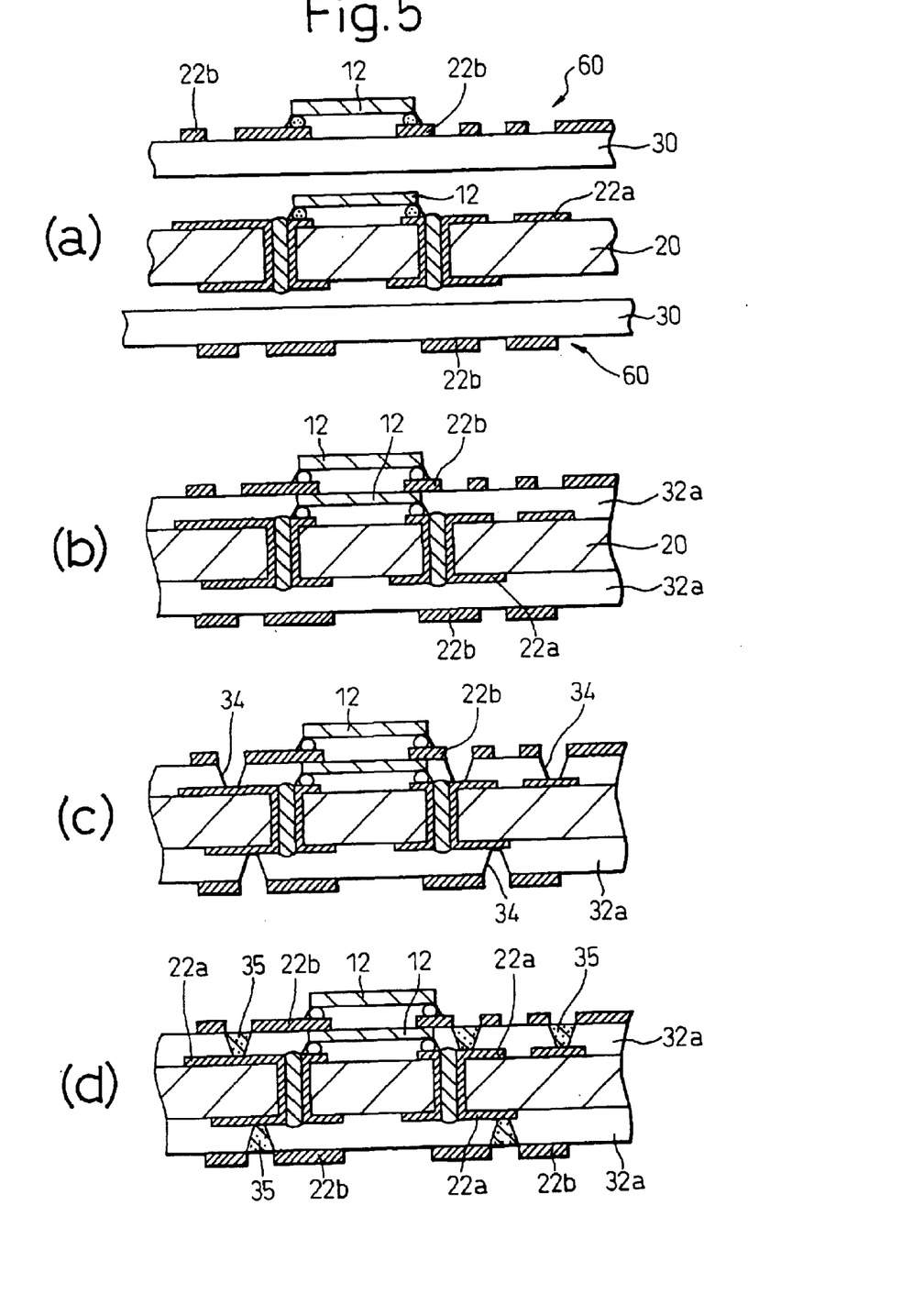
FIG. 5 is an explanatory view showing still another production method of a semiconductor device according to the present invention.

FIG. 5 shows a production method of a semiconductor device according to still another embodiment of the present invention. In this embodiment, semiconductor chips 12 are mounted to a core substrate 20 as shown in FIG. 1(b) and then a film 60, on which a wiring pattern 22b is formed in advance and predetermined semiconductor chips 12 and circuit components are mounted, is heat-bonded to the core substrate 20 to fabricate the semiconductor device.

The film 60 includes the wiring pattern 22b, as the second layer of the substrate that is formed in advance into a predetermined pattern on one of the surfaces of the pre-preg 30 having an electrical insulating property and adhesion property such as polyimide or polyphenylene. This embodiment uses the film 60 having mounted thereto the predetermined semiconductor chips 12 and circuit components 40 to be mounted to the second layer.

The film 60 uses the pre-preg 30 having the copper foil deposited to one of the surfaces thereof as a film material, and the copper foil is etched into a predetermined pattern. The semiconductor chips 12 are mounted to the film 60 by the flip-chip bonding method and the predetermined circuit components 40 are mounted, too.

FIG. 5(b) shows the state where the film 60 is positioned and heat-bonded to the core substrate 20. The pre-preg 30 is heat-bonded to the core substrate 20, forming the electric insulating layer 32a. The electric insulating layer 32a supports the wiring pattern 22b of the second layer and the semiconductor chips 12 electrically connected to the wiring pattern 22b.

FIG. 5(c) shows the state where the laser beam is irradiated to the electric insulating layer 32a to form via-holes 34.

FIG. 5(d) shows the state where a conductive paste 35 is packed into the via-holes 34. In consequence, the conductive paste 35 electrically connects the wiring pattern 22a of the first layer to the wiring pattern 22b of the second layer.

When the construction shown in FIG. 4(d) is compared with the construction shown in FIG. 5(d), the construction shown in FIG. 5(d) is different in that the semiconductor chips 12 are already mounted to the second layer.

The electric insulating layer 32b of the second layer is formed in the same way as described above. Namely, the film 60 comprising the pre-preg 30 in which the wiring pattern is formed in advance on one of its surfaces and the predetermined semiconductor chips 12 and circuit components 40 are mounted is further heat-bonded. Since the semiconductor chips 12 and the wiring pattern 22b are covered with the electric insulating layer 32b, the via-holes 34 are formed in the electric insulating layer 32b formed afresh in the same way as the method described above, and the conductive paste 35 is packed into the via-holes 34, thereby giving the semiconductor device in which the semiconductor chips 12 and the circuit components 40 are electrically connected to the required wiring patterns 22a, 22b and 22c.

Incidentally, the method of each of the embodiments explained above can be selected and utilized suitably to electrically connect the wiring pattern between the layers and to serially laminate the electric insulating layers and the wiring patterns for producing the semiconductor device, and the sequence of the steps in the foregoing embodiments is not restrictive, in particular.

Though the semiconductor chips 12 are mounted by flip-chip bonding in the present invention, it is also possible to employ a method that forms solder bumps on the semiconductor chips 12 for the purpose of connection, a method that forms gold stud bumps on the semiconductor chips 12 and forms solder bumps at pad portions on the substrate side for connection, and so forth.

In the foregoing embodiments, the same number of electric insulating layers and wiring patterns are disposed on both surfaces of the core substrate 20, but the numbers of the electric insulating layers and the wiring patterns are not limited, in particular.

In the semiconductor device and the production method thereof according to the present invention, the semiconductor chips and required circuit components are assembled and mounted to the inside layers of the substrate. Therefore, a semiconductor device having composite functions can be formed extremely compactly, and a semiconductor device having excellent performance can be obtained. Since the semiconductor chips are mounted by flip-chip bonding, semiconductor devices can be produced while a product test is being carried out, and the reliability of the products can be improved by preventing the occurrence of defective products.

What is claimed is:

1. A method of producing a semiconductor device including an insulating core substrate, a plurality of layers of wiring patterns on said core substrate, and insulating layers each interposed between said wiring patterns, each adjacent pair of said wiring patterns being electrically connected to each other through conductor portions penetrating through said insulating layer interposed between said adjacent wiring patterns, said method comprising the steps of:

press-bonding an electric insulating film to a surface of the core substrate, on which surface semiconductor chips connected electrically to said wiring patterns by flip-chip bonding are mounted, to form an electric insulating layer covering said semiconductor chips and said wiring patterns;

forming via-holes in said electric insulating layers to expose said wiring pattern as a bottom thereof;

forming a plating power feed layer for electrolytic plating on an inner surface of said via-holes and on a surface of said electric insulating layer, electrolytically plating said plating power feed layer to form a via-portion on the inner surface of each of said via-holes and a conductor layer on the surface of said electric insulating layer;

etching said conductor layer to form a wiring pattern electrically connected to said wiring pattern of a lower layer through said via-portion; and mounting said semiconductor chips on said wiring pattern, and forming an electrical connection, by flip-chip bonding.

2. A method of producing a semiconductor device including an insulating core substrate, a plurality of layers of wiring patterns on said core substrate, and insulating layers each interposed between said wiring patterns, each adjacent pair of said wiring patterns being electrically connected to each other through conductor portions penetrating through said insulating layer interposed between said adjacent wiring patterns, said method comprising the steps of:

press-bonding an electric insulating film to a surface of the core substrate, on which surface semiconductor chips connected electrically to said wiring patterns by flip-chip bonding are mounted, to form an electric insulating layer covering said semiconductor chips and said wiring patterns;

forming via-holes in said electric insulating layer to expose said wiring patterns as a bottom thereof;

forming a plating power feed layer for electrolytic plating, on an inner surface of said via-holes and on a surface of said electric insulating layers;

forming a resist pattern exposing a portion, on which said wiring pattern is to be formed, on said plating power feed layer, and conducting electrolytic plating with said resist pattern as a mask;

removing said resist pattern, removing said plating power feed layer exposed after the removal of said resist pattern, and forming a wiring pattern electrically connected to said wiring pattern of a lower layer through a via-portion formed in each of said via-holes; and mounting semiconductor chips on said wiring pattern, and forming an electrical connection, by flip-chip bonding.

3. A method of producing a semiconductor device including an insulating core substrate, a plurality of layers of wiring patterns on said core substrate, and insulating layers each interposed between said wiring patterns, each adjacent pair of said wiring patterns being electrically connected to each other through conductor portions penetrating through said insulating layer interposed between said adjacent wiring patterns, said method comprising the steps of:

press-bonding one of the surfaces of an electric insulating film having a conductor layer formed on the other surface thereof to a surface of the core substrate, on which surface semiconductor chips electrically connected to said wiring pattern by flip-chip bonding are mounted, to form an electric insulating layer covering said semiconductor chips and said wiring patterns;

etching said conductor layer to form a wiring pattern on a surface of said electric insulating layer;

forming via-holes in said electric insulating layer to expose said wiring pattern of a lower layer as a bottom thereof;

forming a connection portion in each of said via-holes so as to electrically connect said wiring pattern of a lower layer and said wiring pattern formed in said electric insulating layer; and mounting said semiconductor chips while being electrically connected by flip-chip bonding to said wiring pattern formed on the surface of said electric insulating layer.

4. A method of producing a semiconductor device including an insulating core substrate, a plurality of layers of wiring patterns on said core substrate, and insulating layers each interposed between said wiring patterns, each adjacent pair of said wiring patterns being electrically connected to each other through conductor portions penetrating through said insulating layer interposed between said adjacent wiring patterns, said method comprising the steps of:

press-bonding one of the surfaces of an electric insulating film having said semiconductor chips mounted thereon and electrically connected to said wiring pattern by flip-chip bonding and having a predetermined wiring pattern formed on the other surface thereof, to a surface of the core substrate, on which surface semiconductor chips connected electrically to said wiring pattern by flip-chip bonding are mounted, to form an electric insulating layer covering said semiconductor chips and said wiring patterns;

forming via-holes in said electric insulating layer to expose said wiring pattern of a lower layer as a bottom thereof; and forming a connection portion in each of said via-holes to electrically connect said wiring pattern of a lower layer to said wiring pattern formed on said electric insulating layer.

* * * * *